US00RE50814E

(19) United States
(12) Reissued Patent
Subburaj et al.

(10) Patent Number: US RE50,814 E
(45) Date of Reissued Patent: *Mar. 10, 2026

(54) DYNAMIC MEASUREMENT OF FREQUENCY SYNTHESIZER NOISE SPURS OR PHASE NOISE

(71) Applicant: TEXAS INSTRUMENTS INCORPORATED, Dallas, TX (US)

(72) Inventors: Karthik Subburaj, Bangalore (IN); Sreekiran Samala, Plano, TX (US); Raghu Ganesan, Bangalore (IN)

(73) Assignee: TEXAS INSTRUMENTS INCORPORATED, Dallas, TX (US)

( * ) Notice: This patent is subject to a terminal disclaimer.

(21) Appl. No.: 18/143,211

(22) Filed: May 4, 2023

Related U.S. Patent Documents

Reissue of:
(64) Patent No.: 9,696,359
Issued: Jul. 4, 2017
Appl. No.: 14/588,079
Filed: Dec. 31, 2014

U.S. Applications:
(63) Continuation of application No. 17/154,611, filed on Jan. 21, 2021, now Pat. No. Re. 49,571, which is a
(Continued)

(51) Int. Cl.
*H03L 7/06* (2006.01)
*G01R 29/26* (2006.01)
(Continued)

(52) U.S. Cl.
CPC ..... *G01R 29/26* (2013.01); *G01S 7/03* (2013.01); *G01S 7/4008* (2013.01);
(Continued)

(58) Field of Classification Search
CPC ..... G01R 29/26; G01S 7/03; G01S 7/4008; G01S 7/4017; G01S 13/343; G01S 13/345; G01S 13/931; H03L 7/06
See application file for complete search history.

(56) References Cited

U.S. PATENT DOCUMENTS 5,942,949 A 8/1999 Wilson
6,952,124 B2 10/2005 Pham
(Continued)

*Primary Examiner* — Mark Sager
(74) *Attorney, Agent, or Firm* — Michelle F. Murray; Frank D. Cimino

(57) ABSTRACT

A method of measuring phase noise (PN). A PLL frequency synthesizer is provided including a first phase frequency detector (PFD) receiving a reference frequency signal coupled to a first charge pump (CP) coupled to a VCO having an output fedback to the first PFD through a feedback divider that provides a divided frequency signal to the first PFD which outputs an error signal, and PN measurement circuitry including a replica CP coupled to an output of a second PFD or the first PFD. The error signal is received at the replica CP or the divided and reference frequency signal are received at the second PFD, wherein the replica CP outputs a scaled phase error current which is current-to-voltage converted and amplified to provide an amplified phase error voltage, and digitized to provide a digital phase error signal. The digital phase error signal is frequency analyzed to generate a PN measurement.

22 Claims, 11 Drawing Sheets

Related U.S. Application Data continuation of application No. 16/503,240, filed on Jul. 3, 2019, now Pat. No. Re. 48,613, which is an application for the reissue of Pat. No. 9,696,359.

(51) Int. Cl.

| | |
|---|---|
| ***G01S 7/03*** | (2006.01) |
| ***G01S 7/40*** | (2006.01) |
| ***G01S 13/34*** | (2006.01) |
| ***G01S 13/931*** | (2020.01) |

(52) U.S. Cl.

CPC ..... *G01S 7/4017* (2013.01); *G01S 13/343* (2013.01); *G01S 13/345* (2013.01); *G01S 13/931* (2013.01); *H03L 7/06* (2013.01)

(56) References Cited

U.S. PATENT DOCUMENTS

| | | | |
|---|---|---|---|
| 7,221,921 | B2 | 5/2007 | Maligeorgos et al. |
| 7,821,343 | B1 * | 10/2010 | Wong et al. |
| 7,924,101 | B1 | 4/2011 | Crawford |
| 8,159,298 | B2 | 4/2012 | Quack et al. |
| RE48,613 | E | 6/2021 | Subburaj et al. |
| 2006/0214737 | A1 | 9/2006 | Brown et al. |
| 2008/0224789 | A1 * | 9/2008 | Chang et al. |

* cited by examiner

| OFFSET FREQUENCY | PN dBc/Hz | SPHI (MAG) rAD/$\sqrt{Hz}$ | IN A$\sqrt{Hz}$ | PT ADC IN V$\sqrt{Hz}$ | ADC PSD (dBV r.m.s./Hz) |
|---|---|---|---|---|---|
| 1.00E+06 | -139 | 1.5849E-07 | 3.17E-11 | 1.27E-06 | -1.18E+02 |
| 1.00E+07 | -158 | 1.7783E-08 | 3.56E-12 | 1.42E-07 | -1.37E+02 |
| 2.00E+07 | -164 | 8.9125E-09 | 1.78E-12 | 7.13E-08 | -1.43E+02 |

FIG. 5

- TO MEASURE PN, PERFORM FFT:
  - COLLECT ADC DATA AT Fs = 20MHz ADC DATA
  - N = 2K POINTS
  - Fbin = 10KHz
- TO MEASURE PHASE SPUR:
  - PERFORM MULTI FFTs AND NON-COHERENTLY ACCUMULATE
  - PHASE SPUR DETECTION IS INHERENTLY LIMITED BY PHASE NOISE

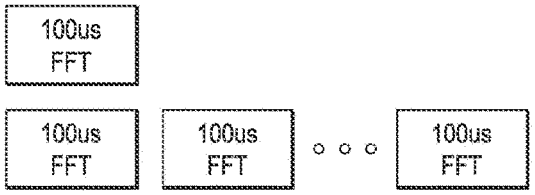

USE NON-COHERENT ACCUMULATION (NCA) OF MANY FFTs FOR IMPROVING SPUR DETECTION

CHOOSE #FFT (NCA) BASED ON SPUR DETECTION SENSITIVITY AND ALLOTTED MEASUREMENT TIME

| FFT PARAMETERS Fs, # POINT, TIME | # FFT | NOISE IN FFT BIN, dBc | SPUR DETECTABLE (18dB, SNR), dBc | TOTAL MEASUREMENT TIME (+Δ FOR FFT/NCA/SNR COMPUTATION) |
|---|---|---|---|---|
| 20M, 2K, 100us | 1 | -62 | -44 | 100us + Δ |
| 20M, 2K, 100us | 4 | -62 | -50 | 400us + Δ |
| 20M, 2K, 100us | 8 | -62 | -53 | 800us + Δ = 1ms |
| 20M, 2K, 100us | 40 | -62 | -60 | 4ms + Δ = 5ms |
| 16M, 2K, 128us | 1 | -63 | -45 | 128us + Δ |
| 16M, 2K, 128us | 4 | -63 | -51 | 500us + Δ |
| 16M, 2K, 128us | 8 | -63 | -54 | 1ms + Δ = 1.2ms |
| 16M, 2K, 128us | 40 | -63 | -61 | 5ms + Δ = 5.5ms |

FIG. 6

DYNAMIC MEASUREMENT OF FREQUENCY SYNTHESIZER NOISE SPURS OR PHASE NOISE

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS REFERENCE TO RELATED APPLICATIONS*

*Notice: more than one reissue application has been filed for the reissue of U.S. Pat. No. 9,696,359, The reissue applications are: U.S. patent application Ser. No. 16/503,240, filed Jul. 3, 2019, now Reissue Pat. No. RE48613, U.S. patent application Ser. No. 17/154,611, filed Jan. 21, 2021, where U.S. patent application Ser. No. 17/154,611 is a continuation reissue of U.S. patent application Ser. No. 16/503,240, and U.S. patent application Ser. No. 18/143,211, filed May 4, 2023, is a continuation reissue of U.S. patent application Ser. No. 17/154,611. This application is a continuation reissue of U.S. patent application Ser. No. 17/154,611, which is a continuation reissue of U.S. patent application No. 16/503,240, which is a reissue of U.S. Pat. No. 9,696,359, filed on Dec. 31, 2014, and issued Jul. 4, 2014. The above referenced applications are hereby incorporated by reference.*

FIELD

Disclosed embodiments relate to dynamic measuring noise spurs or the phase noise generated by frequency synthesizers.

BACKGROUND

A frequency synthesizer comprises an electronic system which generates at its output a higher frequency signal(s) from the lower frequency signal received from a single fixed time base or master oscillator. A common way to implement a frequency synthesizer is with a phase-locked loop (PLL).

A PLL is a feedback control system that includes an error detector (comprising a phase frequency detector coupled to a charge pump) which compares the phases of two input signals (reference frequency signal and frequency divided higher frequency output signal) to produce an error signal that is proportional to the difference between their phases. The error signal is then low pass filtered and used to drive a voltage-controlled oscillator (VCO) which creates the higher output frequency. The output frequency is fed back through a frequency divider to the input of the phase frequency detector, producing a negative feedback loop. If the output frequency drifts, the phase error signal will increase, driving the frequency in the opposite direction so as to reduce the frequency error. Thus, the output is locked to the frequency at the other (reference) input of the error detector. This reference input is usually derived from a crystal oscillator, which is stable in frequency.

One application for frequency synthesizers is for enabling flexible and cost-effective implementation of frequency modulated continuous wave (FMCW) radar systems. For example, automotive radar systems use frequency synthesizers to generate a continuous wave (CW) of constant frequency or time-varying frequency. Since the driver's safety is critical in automotive applications, it is important to continually monitor the performance of the frequency synthesizer with respect to the phase noise in the frequency synthesizer output continuously. Higher phase noise during on field operation relative to a certain acceptable noise level expected during the design of the radar apparatus can cause the radar apparatus to potentially fail to detect some surrounding obstacles. False detection of obstacles where there is actually none is also likely in the presence of phase spurs in the synthesizer output. Hence high phase noise or spurs may render the radar measurements unreliable.

SUMMARY

This Summary briefly indicates the nature and substance of this Disclosure. It is submitted with the understanding that it will not be used to interpret or limit the scope or meaning of the claims.

Disclosed embodiments provides phase noise (PN) measurement circuitry and related methods that can dynamically estimate the PN across a band of frequencies or phase spurs at particular spurious frequency(ies) (spurs) undesirably generated by a phase-locked loop (PLL)-based frequency synthesizer which includes an error detector at its input. As known in the art, spurs are at specific frequencies that usually appear as small amplitude spikes near the carrier frequency, as opposed to PN which is viewed over a range (or band) of frequencies and includes broadband noise generated by all electronic components, and includes shot noise and thermal noise, as well as the noise spurs.

The PN measurement circuitry generally includes its own "replica" PN measurement error detector that receives the same reference frequency signal and divided frequency signal received by the error detector of the frequency synthesizer. The output from the PN measurement error detector is current-to-voltage converted, amplified, digitized, then frequency analyzed to generate a PN measurement at one or more frequencies including a spur (at one or more discrete frequencies) or a PN measure. The term "PN measurement" when referring to spurs is a collection of information which may include whether there exists a spur at one or more frequencies of interest, the spur's magnitude (in dB or dBc) if it exists, and the PN measure referring to the frequency synthesizer's PN power spectral density in some band in the vicinity of that frequency (expressed in dB/Hz or dBc/Hz).

By utilizing a disclosed replica PN measurement error detector, disclosed embodiments essentially avoid perturbing the frequency synthesizer. In a typical implementation the PLL error detector comprises a phase frequency detector (PFD) followed by a charge pump (CP), where the output of the CP is a current which is used by the PN monitor to monitor the operation of the frequency synthesizer. Hence, in this embodiment a replica error detector is used including both a replica PFD and a replica CP. However, in another embodiment, the same PFD as the frequency synthesizer is also used (shared) by the PN measurement circuitry so that the PN measurement circuitry has only a replica CP.

The replica PN error detector or replica CP is configured to match the error detector or CP of the frequency synthesizer. In one embodiment the frequency synthesizer and PN measurement circuitry are both formed in and on the same semiconductor substrate "chip" to provide built-in-self-testing (BIST) for the frequency synthesizer.

As used herein, the replica PN error detector or replica CP is a scaled copy of the components of the error detector (e.g., D-type flip flops of the PFD and positive and negative current sources of the CP of the frequency synthesizer). The replica PN error detector or replica CP is generally fabricated on the same semiconductor substrate as the PLL-based frequency synthesizer, in some embodiments. In some of these embodiments the replica PN error detector or replica CP is also fabricated in close proximity (defined herein as the respective blocks being within 200 μm of one another to the error detector or CP of the frequency synthesizer), such as on a common CMOS die.

Placing the replica PN error detector or replica CP close to the error detector or CP of the frequency synthesizer enables both good transistor matching and a good fit of the error detector response including the noise performance from the replica error detector or replica CP to the response from the error detector or CP of the frequency synthesizer. The scale of the replica PN error detector or replica CP can be larger than the size of the error detector or CP of the frequency synthesizer in some embodiments so that its contribution to overall PN or spurs is lower, though the scale is not necessarily limited to being larger and can be essentially the same size defined herein as being within 20% of one another. In one example embodiment, the respective replica components are about 1.2 times to 5 times the size of the corresponding components in the error detector of the frequency synthesizer.

BRIEF DESCRIPTION OF THE DRAWINGS

Reference will now be made to the accompanying drawings, which are not necessarily drawn to scale, wherein:

FIG. 5 provides a data table which shows calculated measured parameters obtained from the combination circuit shown in FIG. 3 including PN as a function of the offset frequency from a 900 MHz carrier frequency, according to an example embodiment.

FIG. 6 shows example spur detection sensitivity that may be obtained and fast Fourier transform (FFT) durations that may be used with disclosed embodiments, according to an example embodiment.

DETAILED DESCRIPTION

Figure 1:
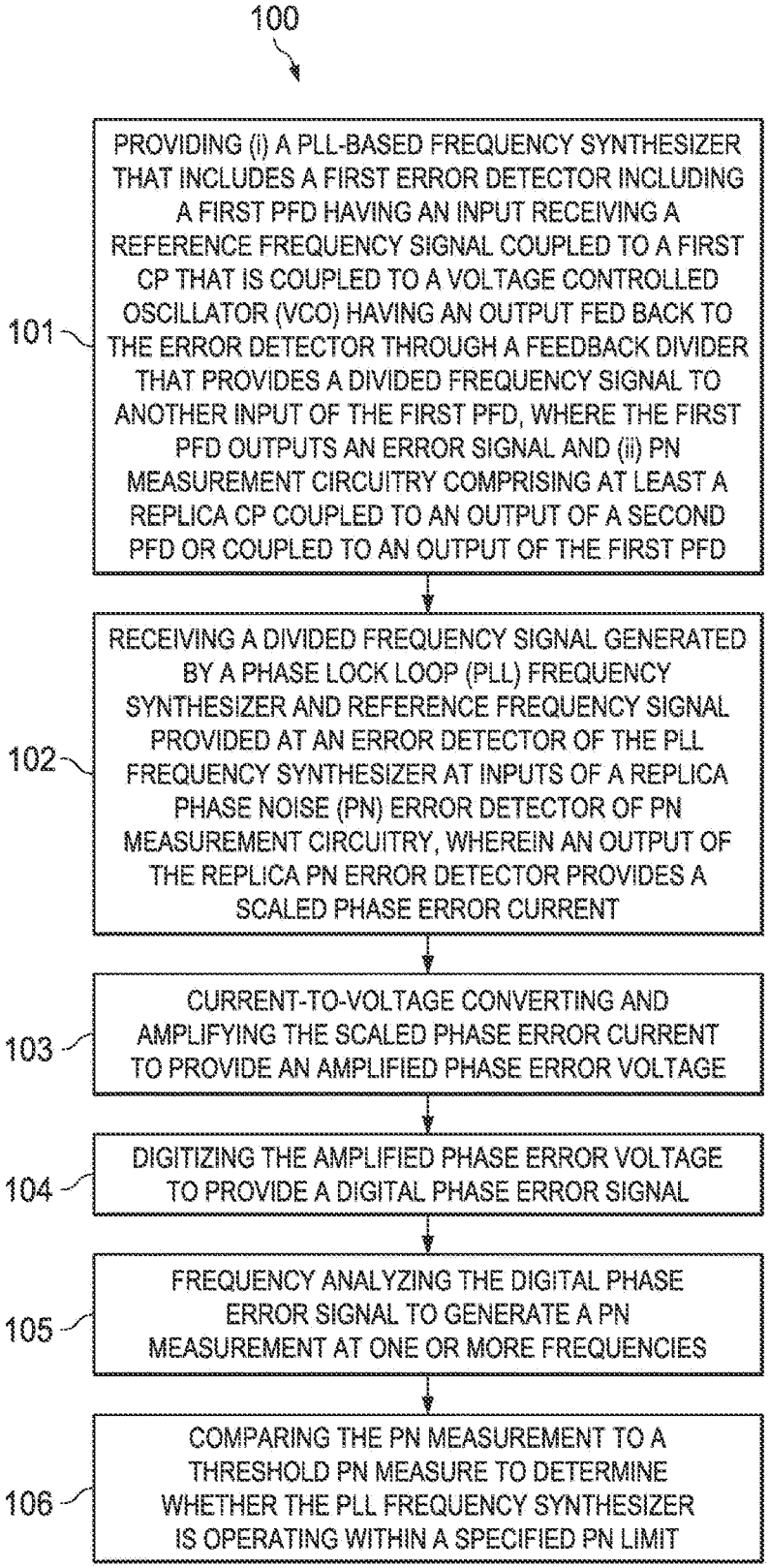
FIG. 1 is a flow chart that shows steps in an example method of dynamic measurement of frequency synthesizer PN or spurs, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed embodiments provide PN measurement circuitry and related methods for measuring the PN of a PLL-based frequency synthesizer, where the PN measurement circuitry includes at least a replica CP, and in some embodiment includes a replica PN measurement error detector including both a replica PFD and a replica CP. The PN measurement circuitry also includes circuitry for amplifying the phase error output provided by the replica PN measurement error detector, as well as circuitry for digitizing, and performing a Fourier transform (FT, e.g., FFT) to measure frequency PN or spur(s) (e.g., 1 MHz PN/spurs). As described above, disclosed PN measurement circuitry can be on the same semiconductor substrate chip as the frequency synthesizer to provide BIST.

FIG. 1 is a flow chart that shows steps in an example method 100 of dynamic measurement of frequency synthesizer noise spurs or PN, according to an example embodiment. Step 101 comprises providing (i) a PLL-based frequency synthesizer that includes a first error detector including a first PFD having an input receiving a reference frequency signal coupled to a first CP that is coupled to a voltage controlled oscillator (VCO) having an output fed back to the error detector through a feedback divider that provides a divided frequency signal to another input of the first PFD, where the first PFD outputs an error signal and (ii) PN measurement circuitry comprising at least a replica CP coupled to an output of a second PFD or coupled to an output of the first PFD.

Step 102 comprises receiving the error signal at an input of the replica CP or the divided frequency signal and reference frequency signal at an input of a second PFD, wherein an output of the replica CP provides a scaled phase error current. In one embodiment the PN measurement circuitry includes the second PFD to provide a replica PN measurement error detector (see the replica PN error detector 221 of PN measurement circuitry 220 shown in FIG. 2A described below), so that the first PFD and second PFD are separate PFDs. In another embodiment the PN measurement circuitry shares the first PFD with the frequency synthesizer.

Step 103 comprises current-to-voltage converting and amplifying the scaled phase error current to provide an amplified phase error voltage. A transimpedance amplifier can be used for providing both the current-to-voltage converting and signal amplifying. Step 104 comprises digitizing the amplified phase error voltage to provide a digital phase error signal, such as using an analog-to-digital converter (ADC). However, besides step 103 comprising current-to-voltage converting then step 104 comprising digitizing a voltage signal, it may be possible to use other techniques to generate a digital phase error signal from the scaled phase error current.

Step 105 comprises frequency analyzing the digital phase error signal to generate a PN measurement at one or more frequencies, such spur(s) around the carrier frequency or a PN spectrum (e.g., spanning at least 4 decades of frequency). For example, the digitized signal's spectrum can be measured using a microcontroller unit (MCU), digital signal processor (DSP) unit or a FFT unit. Step 106 comprises comparing the PN measurement (e.g., power spectral density (PSD)) to a threshold PN measure to determine whether the PLL frequency synthesizer is operating within a specified PN limit. Based on design knowledge (e.g., simulation across voltage and temperature) of the approximate PLL bandwidth, input phase to output phase response and VCO phase to output phase response, a threshold PN measure can be determined.

Any uncertainty in the knowledge of these parameters may be accommodated as an inaccuracy in the synthesizer output noise measurement, where the prediction of synthesizer output noise power or PSD from the measured spectrum is referred to as the synthesizer output noise measurement. It is generally useful to inform the radar system's central processor unit (CPU) or other processor that the frequency synthesizer has degraded in performance with respect to designed expectations, when the measured PN (e.g., PSD) is poorer as compared to programmed noise thresholds. In that case the frequency synthesizer can be automatically disabled as automotive systems are "safety-critical", so that the user can return to manual operation, such as driving without driver assist for automotive applications.

In one particular embodiment the frequency synthesizer provides an 80 GHz output and the PN measurement circuitry detects and reports any degradation in the synthesizer's PN noise performance within 50 ms, such as reporting the degradation to an associated radar system CPU. In another embodiment, the PN measurement(s) are themselves reported to the radar's CPU or other processor, and the radar system's parameters are modified based on this measurement. For example, if the PN measurement indicates higher PN, radar detection algorithms implemented by the CPU may analyze the radar received signal for longer durations before confirming detection of obstacles.

Figure 2A:
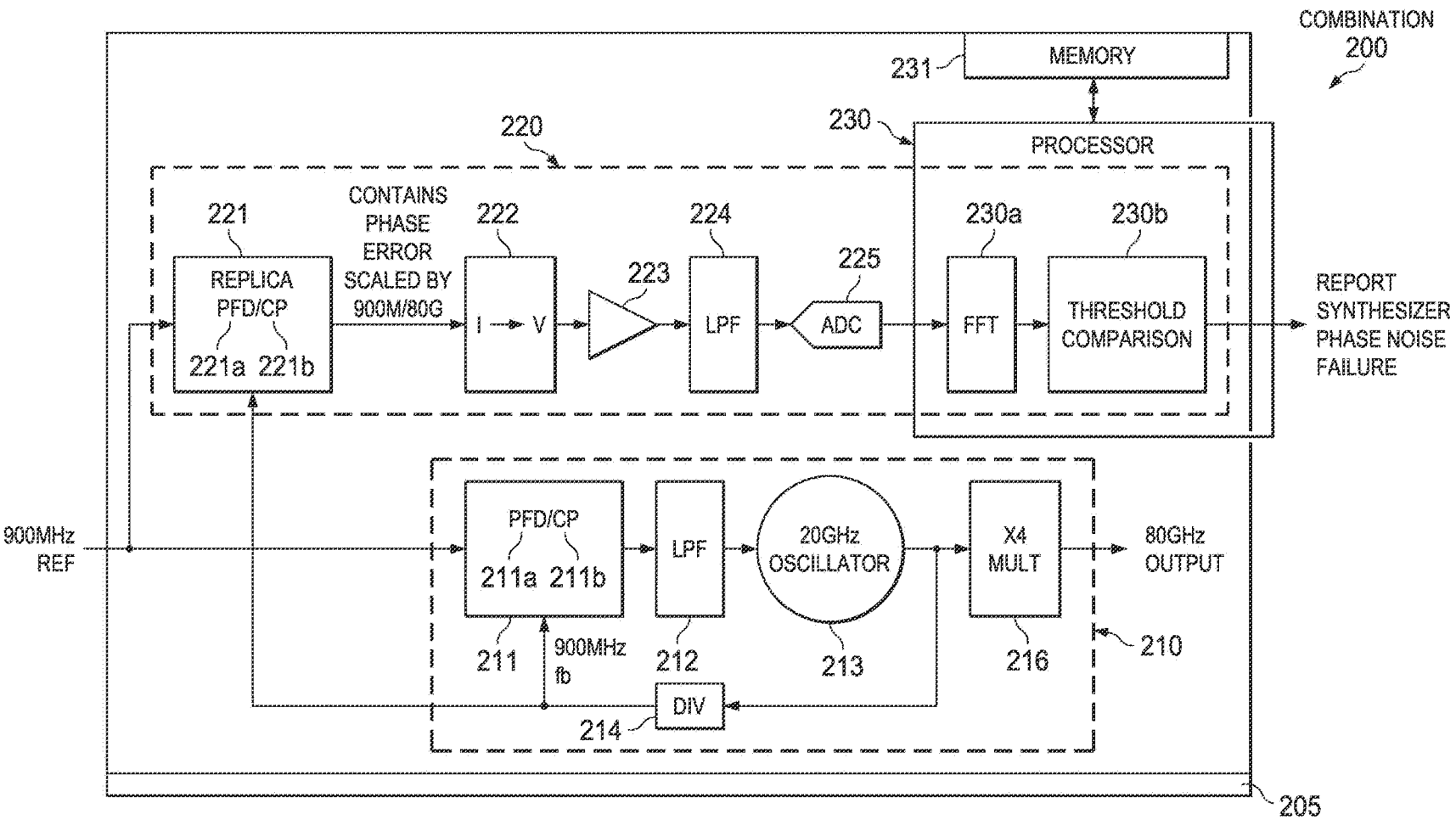
FIG. 2A is a block diagram representation of an example circuit combination comprising a frequency synthesizer and PN measurement circuitry including a replica PN error detector coupled to receive the same reference frequency signal and divided frequency signal received by the error detector of the frequency synthesizer configured for providing dynamic measurement of the PN or spurs generated by the frequency synthesizer, all on a common semiconductor substrate, according to an example embodiment.

FIG. 2A is a block diagram representation of an example circuit combination 200 comprising a frequency synthesizer 210 and PN measurement circuitry 220 coupled to receive the same reference frequency signal and divided frequency signal received by the error detector of the frequency synthesizer, all on a common semiconductor substrate 205, according to an example embodiment. The operating frequencies shown in FIGS. 2A-2C include a 900 MHz carrier frequency and 20 GHz voltage controlled oscillator (VCO) 213 which are only provided as an example to help clarify operation of the circuit combinations shown.

The PLL frequency synthesizer 210 includes an error detector 211 comprising a PFD 211a and CP 211b coupled to receive the 900 MHz reference frequency signal having an output coupled to a low pass filter (LPF) 212 then to VCO 213 shown providing a 20 GHz output having an output fed back to the error detector 211 after frequency division by a feedback divider 214 to provide a divided frequency signal. An optional times 4 (×4) frequency multiplier 216 is shown coupled to an output of the VCO 213 to provide the 80 GHz output shown. The configurations shown are only examples and different combinations of synthesizer (or VCO) frequency and frequency multiplier are possible. However, for ease of explaining the rest of the circuits, certain numbers are used in the rest of this description.

The PN measurement circuitry 220 includes a replica PN measurement error detector 221 shown as PFD/CP including PFD 221a and CP 221b that is coupled to receive the divided frequency signal and the 900 MHz reference frequency signal at respective inputs, and for outputting a scaled phase error current having the phase error shown scaled by 900 MHz/80 GHz. A current-to-voltage (I to V) converter 222 is for current-to-voltage converting and an amplifier 223 is for amplifying the scaled phase error current to provide an amplified phase error voltage. An analog-to-digital converter (ADC) 225 is for digitizing the amplified phase error voltage to provide a digital phase error signal. A LPF 224 is shown between the amplifier 223 and ADC 225.

A processor 230 (CPU, DSP, or MCU) that includes an associated memory 231 provides frequency analyzing shown as including an FFT block 230a which processes the digital phase error signal and generates a PN measurement that is coupled to a threshold comparing block 230b provided by the processor 230 for comparing the measured PN at one or more frequencies (spurs) or a PN spectrum to a threshold PN measure to determine whether the frequency synthesizer 210 is operating within a specified noise limit. In operation of circuit combination 200, the processor 230 of the PN measurement circuitry 220 translates the noise signal at the output of the ADC 225 to PN by knowing the CP current of the replica PN measurement error detector 221, and the gain of the current to voltage converter 222 and amplifier 223. For the example operating frequencies shown, the PN measured at the output of the replica PN measurement error detector 221 is the root mean squared (rms) addition of PN at 1 MHz offset from the 900 MHz reference noise+1 MHz offset VCO 213 Noise.

The LPF 212 typically having about a 500 kHz bandwidth filters the 1 MHz reference noise by about 6 dB, but does not filter the 1 MHz VCO noise. Due to this difference, the measurement of sum total PN may be inaccurate by 0 to 6 dB vs. the actual PN generated by the frequency synthesizer 210. However, the amount of attenuation of VCO noise and reference noise at any frequency is generally predictable from design knowledge and/or the knowledge of the PLL loop bandwidth (which is measurable through calibration procedures known to one skilled in the art). Based on which of the noise sources dominates at any frequency (typically known during the design of the PLL or manufacturing or testing of the chip), appropriate correction scale factors (multiplicative in normal number units and additive in dB units) can be applied during the processing of the digital samples output by the PN measurement circuitry's ADC 225.

In the event that both the VCO and reference noise contribute significantly and similarly to the synthesizer output noise, in one embodiment, the above inaccuracy and the inaccuracy due to other noises and mismatches may be handled by using appropriately modified (typically relaxed) PN comparison thresholds used in determining the occurrence of frequency synthesizer failure. In most safety critical automotive radar applications, such relaxation may be acceptable. In typical frequency synthesizers, the relaxation may be lower than only 6 dB, which means that indication to the radar's CPU may be possibly given by processing the PN measurement circuitry and associated digital processing, if and when the synthesizer PN performance degrades by higher than 6 dB than specification levels. In one embodiment, such inaccuracy may be handled by using stricter PN comparison threshold, so that the frequency synthesizer is deemed to be meeting its PN performance requirements only if the measured PN is 6 dB lower than acceptable levels. In such a case, the reporting of frequency synthesizer failure is pessimistic.

In a typical example frequency synthesizer considered in the Examples section described below, after accounting as described above and for other noises and mismatches it is predicted a ±4 dB accuracy is provided in the −102 dBc/Hz 80 GHz PN level estimation. The ±4 dB accuracy easily satisfies typical safety compliance goals and is a major advance from known techniques that are not able to measure the PN of a frequency synthesizer. PN measurement circuitry 220 can also detect −45 dBc to −60 dBc spurs at 80 GHz depending on allowed on-field test time (e.g., 100 μs to 5 ms).

Figure 2B:
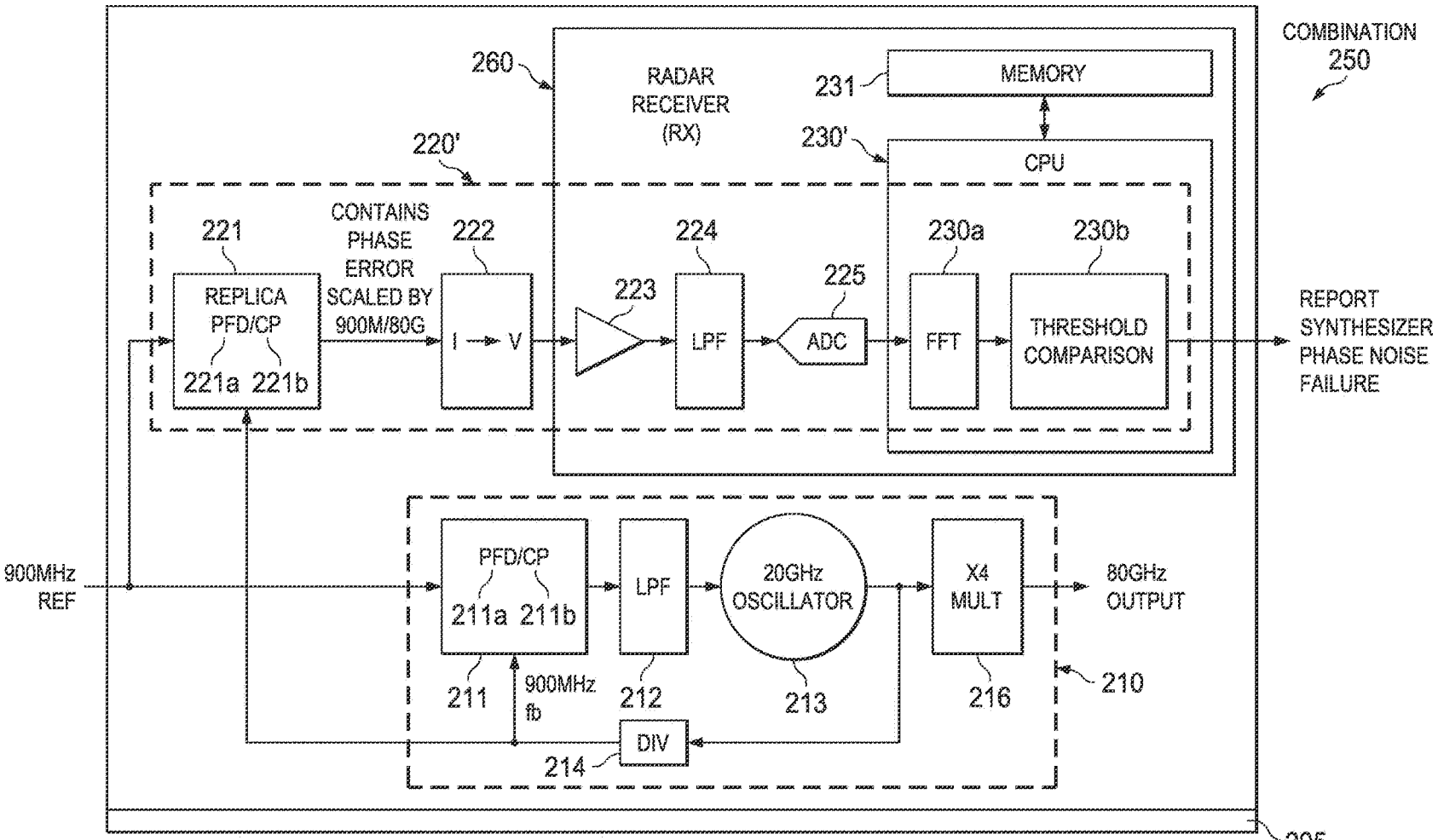
FIG. 2B is a block diagram representation of an example circuit combination comprising a frequency synthesizer and PN measurement circuitry including a replica PN error detector coupled to receive the same reference frequency signal and divided frequency signal received by the error detector of the frequency synthesizer configured for providing dynamic measurement of the PN or spur(s) generated by the frequency synthesizer, all on a common semiconductor substrate together with radar receiver circuitry, according to an example embodiment.

In one arrangement on the same semiconductor substrate there is also formed a radar receiver (RX). FIG. 2B is a block diagram representation of an example circuit combination 250 comprising a frequency synthesizer 210 and PN measurement circuitry 220' including a replica PN measurement error detector 221 coupled to receive the same reference frequency signal and divided frequency signal received by the error detector of the frequency synthesizer configured for providing dynamic measurement of the noise spurs or PN generated by the frequency synthesizer, all on a common semiconductor substrate 205 together with RX 260, according to an example embodiment. In this embodiment the PN measurement circuitry 220 and RX 260 can share several circuit blocks including at least the ADC 225 and processor shown as a CPU 230' (as well as the amplifier 223 and LPF 224 as shown), to conserve die area and reduce cost.

As shown in FIG. 2B, the RX 260 and PN measurement circuitry 220 thus share the amplifier 223, LPF 224, ADC 225, CPU 230' and memory 231. As a result, circuit combination 250 may only occupy about <<0.05 $mm^2$ of chip area due to sharing of circuit blocks including the generally relatively large area ADC 225 with the RX 260. Time multiplexing can be used to share amplifier 223 and ADC 225 between RX 260 and PN measurement circuitry 220. For applications such as frequency modulated continuous wave (FMCW) radar, during the inter-frame intervals when the RX 260 is not receiving any signal, so that the amplifier 223 and ADC 225 can be used by the PN measurement circuity 220, while in normal operation when the RX 260 is demodulating the received FMCW signals amplifier 223 and ADC 225 can be used by the RX 260. Inter-frame time refers to the time when the FMCW radar chip is not chirping or transmitting chirps and processing the received signal for performing detection of objects around the FMCW radar apparatus and computing their location and velocity.

Figure 2C:
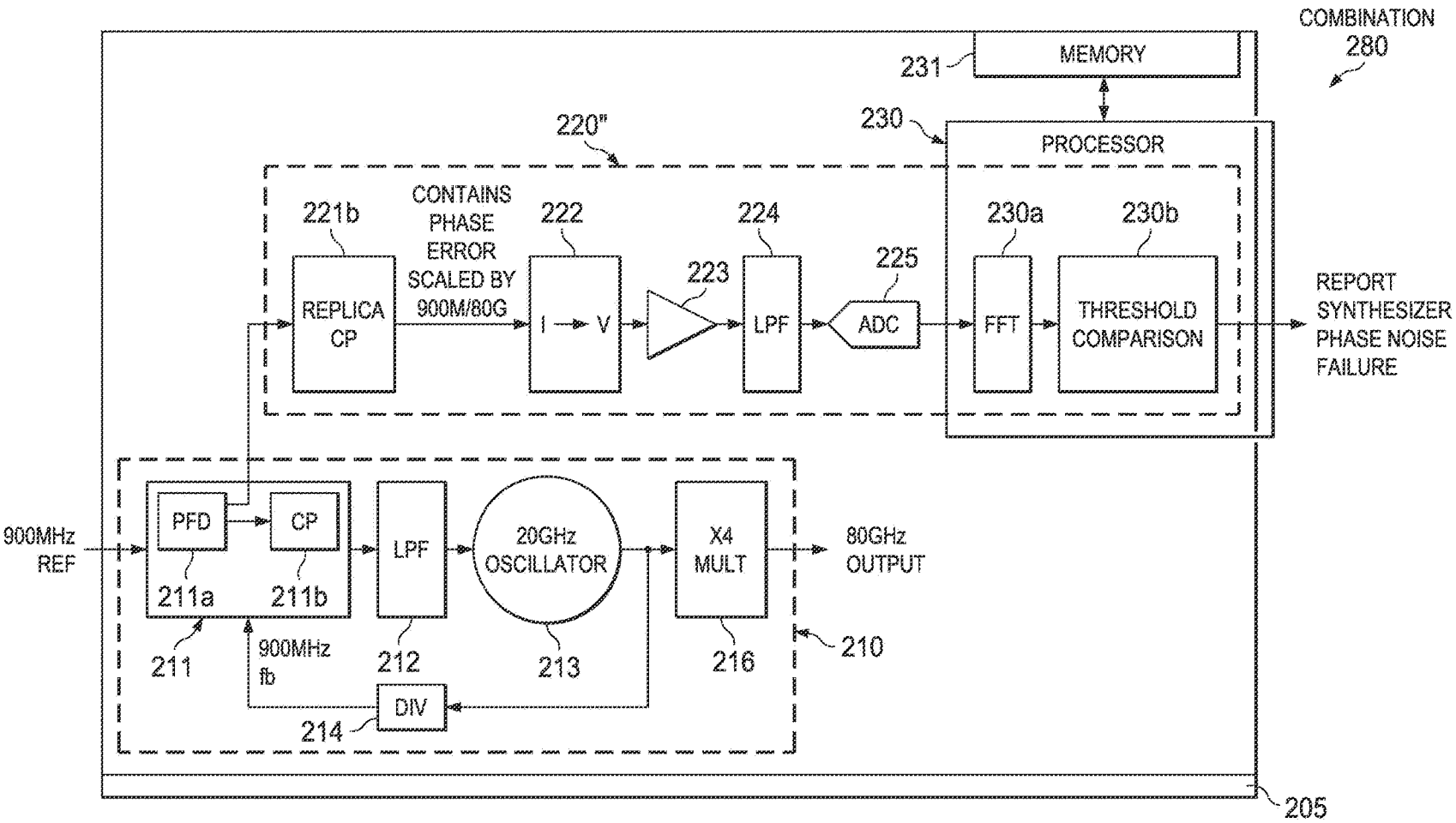
FIG. 2C is a block diagram representation of an example circuit combination comprising a frequency synthesizer and PN measurement circuitry that shares the same (common) PFD as the frequency synthesizer and includes a replica CP coupled to receive the error signal generated by the common PFD configured for providing dynamic measurement of the PN or spur(s) generated by the frequency synthesizer, all on a common semiconductor substrate, according to an example embodiment.

FIG. 2C is a block diagram representation of an example circuit combination 280 comprising a frequency synthesizer 210 and PN measurement circuitry 220" that shares the same (common) PFD 211a as the frequency synthesizer and includes a replica CP 221b coupled to receive the error signal generated by the PFD 211a configured for providing dynamic measurement of the noise spurs or PN generated by the frequency synthesizer 210, all on a common semiconductor substrate 205, according to an example embodiment. This embodiment has the advantage of a further reduced die area compared to circuit combination 200 shown in FIG. 2A.

Figure 3:
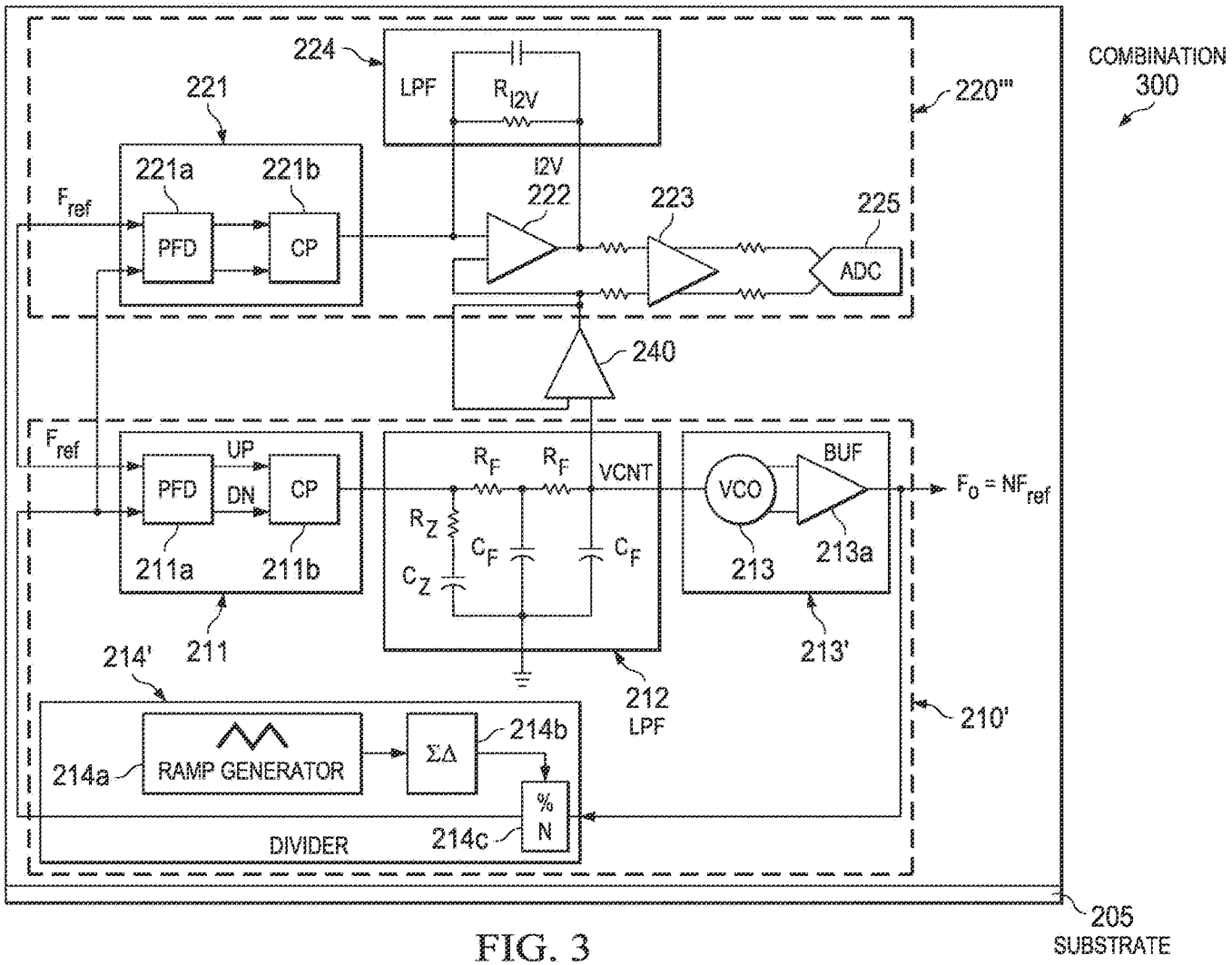
FIG. 3 is a circuit and block diagram representation of an example single chip combination circuit that includes PN measurement circuitry including a replica PN error detector providing BIST for measuring the PN or spur(s) of the frequency synthesizer, according to an example embodiment.

FIG. 3 is a circuit and block diagram representation of an example single chip combination circuit 300 that includes PN measurement circuitry 220''' providing BIST for providing PN measurements for the PN generated by the PLL frequency synthesizer 210', according to an example embodiment. There is a buffer 240 shown connected between the output of the LPF 212 at the node shown as VCNT (that is an arbitrary voltage) which provides its input and the node that provides inputs to both I2V 222 and an input of the amplifier 223 at its output. Because the output of the buffer 240 is fed to the input of the I2V 222 and to an input of the amplifier 223, the noise in the buffer 240 and the arbitrary reference voltage VCNT gets cancelled. The VCO block of the frequency synthesizer 210' is shown as 213' and includes a VCO 213 and a buffer 213a. The divider of the frequency synthesizer 210' is shown as 214' and includes a ramp generator 214a, a digital high speed ΣΔ (sigma delta) modulator 214b and a % N" circuit 214c.

The ramp generator 214a is generally digital hardware that can generate triangular, saw-tooth or staircase waveforms in order for the frequency synthesizer 210' to output a CW whose frequency varies over time in a triangular, saw-tooth, stair-step fashion, respectively. The ramp generator 214a can also generate a constant output so that the frequency synthesizer's output is a CW of constant frequency. The ramp generator's digital output is given to a digital high speed signal delta modulator 214b that is operating on the divider's output clock and provides to the % N circuit 214c at every output clock of the divider, a division factor that it should divide the divider's input clock by, during the subsequent output clock cycle. The % N circuit 214c is generally a digital state machine that creates an output clock whose cycle length (or period) is the division factor N times the divider's input clock period. The division factors are generally positive integers (e.g., 19, 20, 21) and ramp generator's digital output is a digital word with a very fine resolution, (e.g., 0.001, so that it can represent values such as 18.998, 18.999, 19, 19.001, . . . , 19.501, 19.502, . . . , 20, 20.001, . . . 21, 21.001, 21.002, . . . The digital high speed sigma delta modulator 214b operates in a way such that the local average of its integer output is equal to that of the ramp generator's digital output.

The processing of the ADC output samples to find synthesizer PN and spurs can be performed in hardware and/or in processor such as in software or firmware. Such processing is explained in two example embodiments below.

The processing is explained for the first embodiment using equations or processing steps described below:

a. Let x[n] be the digital samples output by the PN measurement circuitry's ADC. Collect N such successive samples. Hence x[n], where n=0 to N-1 is available in the processor's memory as a block sequence of numbers.

b. Perform a FFT on x[n] to obtain the FFT result, X[k] where k=0 to N-1.

c. Find the signal Y[k]=X[k]*X[k], where the operation ".*" represents element-wise multiplication. E.g. Y[0]=X[0]*X[0] where "*" represents multiplication. In other embodiments, Y[k]=|X[k]| may be found with equivalent PN measurement performance. Here |X[k}]| represents the absolute value of the sequence X[k], and the meaning of "absolute value" is well known to mathematicians and engineers skilled in the art.

d. Optionally, repeat the steps a, b, c many (say L) times (iterations i=1 to L). Each time the digital samples collected are different as fresh collections are made and noise is expected to vary over time. Let the signal Y[k] obtained in the i'th iteration be represented as Yi[k].

e. Find the signal Z[k]=$\text{Sum}_{Over\ i=1\ to\ L}$ of Yi[k], where the summation means that Z[0]=Y1[0]+Y2[0]+Y3[0]+ . . . +YL[0], Z[1]=Y1[1]+Y2[1]+Y3[1]+ . . . +YL[1], . . . Z[k]=Y1[k]+Y2[k]+Y3[k]+ . . . +YL[k], for any k=0 to N-1. This summation is also referred to as Non-Coherent Accumulation of FFT output elsewhere in this document.

f. To find the PN in the frequency band 0.5 MHz to 1.5 MHz (e.g.) find KLOWER=the integer nearest to $(0.5\times 10^6/Fs)*N$, where Fs is the ADC sampling rate (e.g. 20 MHz) and find KUPPER=the integer nearest to $(1.5\times 10^6/Fs)*N$.

g. Find the PN power in the frequency band, P=Sum of Z[KLOWER to KUPPER], i.e. P=Z[KLOWER]+Z[KLOWER+1]+Z[KLOWER+2]+ . . . Z[KUPPER].

h. Account for the scale factors anticipated from design knowledge of PLL filter bandwidth, the gain in the trans-impedance amplifiers, the ratio of synthesizer PLL's reference frequency and the radar's output frequency and other parameters in the PN measurement analog circuitry by scaling the number P by a number pre-stored in the processor's memory based on the design knowledge. These factors are intended to convert the measured noise power into the anticipated PN if truly measured at synthesizer output.

i. Find the PN power in dB scale, P_dB=10*log 10(P), where log 10 represents logarithm to the base 10.

j. Output the estimated PN power to the radar apparatus's central processing unit or other processor. Also compare the estimated PN power P_dB with threshold pre-stored in the processor's memory and indicate to the radar apparatus's central processing unit or other processor that the synthesizer PLL performance is below acceptable levels if P_dB exceeds the threshold.

k. The scale factors and threshold above may differ for different frequency ranges.

l. To find if there are any phase spurs, use the sequence Z[k] and for each value of k from 0 to N-1, find if Z[k] is significantly higher than the average of some of its neighboring values, AVG[k]=5*(Z[k-LENGTH+1+Z[k-LENGTH+2]+Z[k-LENGTH+3]+ . . . Z[k+LENGTH])/(2*LENGTH). If Z[k]>AVG[k] for any k, output the corresponding power level (using similar methods as explained earlier in the PN power computation steps) and indicate the presence of spur along with the power level to the radar's central processing unit or other processor for appropriate action to ensure safety.

The signal processing is explained in another embodiment using equations or processing steps described below. This processing can be performed in hardware coupled to the ADC or in the form of software or firmware in the processor and in the following explanation, the digital hardware based processing method is explained.

m. Let x[k] be the digital samples output by the PN measurement circuitry's ADC. The ADC continuously outputs samples (one sample every 1/Fs seconds, where Fs is the ADC's sampling rate). The parameter k represents the sample count, which is an integer.

n. Employ a digital filter to attenuate the signal components outside a certain chosen frequency band. E.g. frequency band 0.5 MHz to 1.5 MHz. Let the digital filter's output be represented as the sequence y[n]. Just as the ADC output, the digital filter's output is also continuously streaming.

o. Find the signal Y[k]=X[k].*X[k], where the operation ".*" represents element-wise multiplication. e.g., Y[0]=X[0]*X[0] where "*" represents multiplication. In other embodiments, Y[k]=|X[k]| may be found with equivalent PN measurement performance. Here |X[k}]| represents the absolute value of the sequence X[k], and the meaning of "absolute value" is well known to mathematicians and engineers skilled in the art.

p. Find the PN power in the frequency band, P=average of a block of values of the sequence Z[k]. e.g., P=(Z[K1]+Z[K1+1]+Z[K1+2]+ . . . Z[K1+LENGTH])/LENGTH, where K1 and LENGTH are integers and K1 represents the sample count of the first sample used for the averaging.

q. Account for the scale factors anticipated from design knowledge of PLL filter bandwidth, the gain in the trans-impedance amplifiers, the ratio of synthesizer PLL's reference frequency and the radar's output frequency and other parameters in the PN measurement analog circuitry by scaling the number P by a number pre-stored in the processor's memory based on the design knowledge. These factors are intended to convert the measured noise power into the anticipated PN if truly measured at synthesizer output.

r. Find the PN power in dB scale, P_dB=10*log 10(P), where log 10 represents logarithm to the base 10.

s. Output the estimated PN power to the radar apparatus's central processing unit or other processor. Also compare the estimated PN power P_dB with threshold pre-stored in the processor's memory and indicate to the radar apparatus's central processing unit or other processor that the synthesizer PLL performance is below acceptable levels if P_dB exceeds the threshold.

t. The scale factors and threshold above may differ for different frequency ranges.

In one embodiment a radar apparatus comprises the synthesizer and PN measurement circuitry, transmitter circuits, receiver circuits, ADC and digital processors to detect the presence, location and velocity of surrounding objects. The synthesizer is employed to generate a CW signal of constant frequency or stepped frequency (staircase, where at each frequency, a certain duration of time is spent) or triangular frequency (where frequency increases for a certain time duration and then decreases for a certain time duration) or saw-tooth frequency (where frequency increases/decreases for a certain duration and then returns to the starting frequency quickly) for a certain duration of time, during which the radar apparatus's transmitter is made to emit the signal and receiver's output is processed to detect presence, location and velocity of surrounding objects (collectively called radar processing).

Such a process is repeated after a certain time gap. During this time gap, when the synthesizer is not engaged in the radar processing, the synthesizer is made to generate a CW signal of a similar frequency pattern as during radar processing and the PN measurement circuitry and associated computations are employed to measure the synthesizer PN and determine if it is within acceptable limits. Hence, the PN measurement process may be performed at regular intervals when the synthesizer is not engaged in radar processing, such as every 100 ms, the PN measurement process being repeated.

A synthesizer that generates a staircase, triangular or saw-tooth frequency is said to be an FMCW synthesizer and the signal generated is said to be an FMCW signal. The ramp generator 214a is generally digital hardware that can generate triangular, saw-tooth or staircase waveforms in order for the frequency synthesizer 210' to output a CW whose frequency varies over time in a triangular, saw-tooth, staircase fashion respectively. It can also generate a constant output so that the frequency synthesizer output is a CW of constant frequency.

In another embodiment the PN measurement circuitry reuses some parts/circuits of the radar apparatus's receiver, such as the amplifiers and ADC that are engaged in the radar processing are used for PN measurement process, when the PN measurement is performed in time slots when the normal radar processing is not ongoing. In another embodiment, the PN measurement circuitry does not reuse any parts/circuits of the radar apparatus's receiver. In that embodiment, the PN measurement process is performed during the radar processing itself.

Figure 4A:
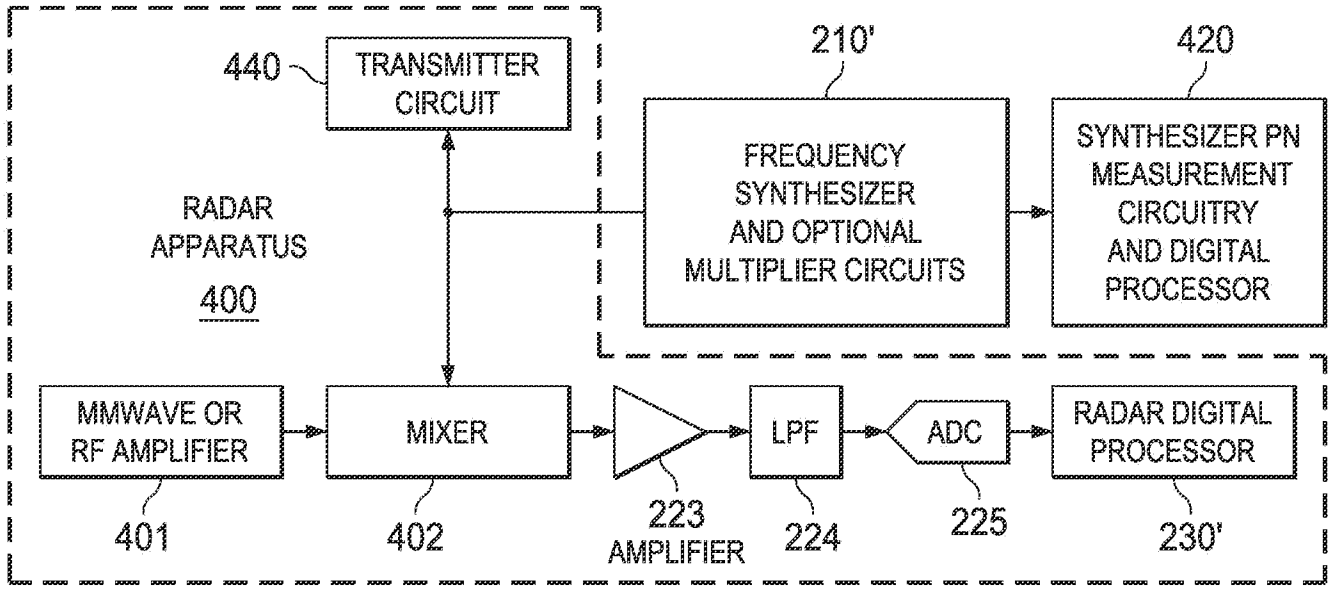
FIG. 4A is a block diagram depiction of an example radar apparatus configured so that the PN measurement circuitry is independent of the normal radar receiver path, according to an example embodiment.

FIG. 4A is a block diagram depiction of an example radar apparatus 400 configured so that the PN measurement circuitry digital process block 420 is independent of normal radar receiver path, according to an example embodiment. Radar apparatus 400 is shown including in series connection mm-wave or RF amplifier 401, mixer 402, amplifier 403, LPF 224, ADC 225 and radar signal processor 230'. Radar apparatus 400 also includes a transmitter circuit 440.

An output of the frequency synthesizer 210' is coupled to an input of the transmitter circuit 440 and the mixer 402. Another output of the frequency synthesizer 210' is coupled to an input of a synthesizer PN measurement circuitry and digital process block 420. The frequency synthesizer 210' is an FMCW synthesizer and its output signal is amplified and transmitted on air by the transmitter circuit 440. Reflections of that transmitted signal from objects near the radar apparatus are received and amplified by mm-wave or RF amplifier 401 and the amplified output is mixed with the FMCW synthesizer output by mixer 402 and the mixer's output is amplified by amplifier 223, low pass filtered by LPF 224, digitized by ADC 225 and digitally processed by the radar digital processor 230'.

Figure 4B:
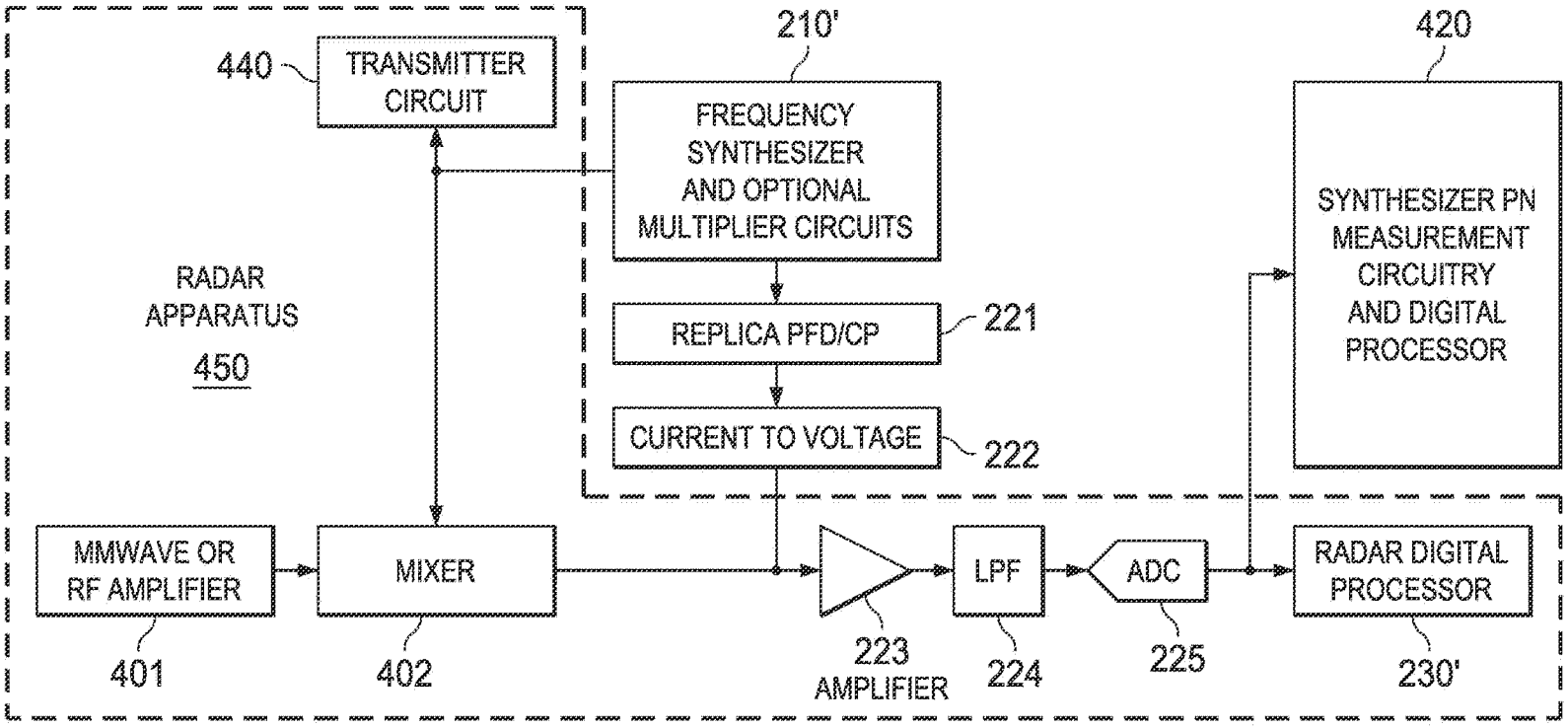
FIG. 4B is a block diagram depiction of an example radar apparatus configured so that the PN measurement circuitry reuses/shares circuits of the normal radar receiver path of the radar apparatus, according to an example embodiment.

FIG. 4B is a block diagram depiction of an example radar apparatus 450 configured so the PN measurement circuitry digital process block 420 reuses/shares circuits of the normal radar receiver path of the radar apparatus, according to an example embodiment. Only one of the paths is engaged/active at any given time, with the other path being disabled. In this embodiment the output of the ADC 225 is coupled to an input of the synthesizer PN measurement circuitry and digital process block 420.

The frequency synthesizer 210' is an FMCW synthesizer and its output signal is amplified and transmitted on air by the transmitter circuit 440. Reflections of that transmitted signal from objects near the radar apparatus are received and amplified by mm-wave or RF amplifier 401 and the amplified output is mixed with the FMCW synthesizer output by mixer 402 and the mixer's output is amplified by amplifier 223, low pass filtered by LPF 224, digitized by ADC 225 and digitally processed by the radar digital processor 230'. In order to reduce the semiconductor (e.g., silicon) chip area additionally needed for the PN measurement circuitry, the radar receiver's amplifier 223, LPF 224 and ADC 225 are reused for the PN measurement, so that no such extra circuits are needed to be placed on the chip explicitly and dedicated only for the PN measurement.

In the disclosed radar apparatuses, there are durations when normal radar operation is halted and such halt periods occur between durations where normal radar operation occurs. In a circuit combination as shown in FIG. 4B, when normal radar operation is not occurring, the PN measurement process is performed and the ADC 225's output is used by the digital processor of the PN measurement circuitry digital process block 420. At the same time it is made sure that the mixer 402's output doesn't cause changes to the amplifier 223's input and only the current to voltage convertor 222's output drives the amplifier 223. When normal radar operation is occurring, the PN measurement process is not performed simultaneously and the ADC 225's output is not used by the digital processor of the PN measurement circuitry digital process block 420. At that time it is made sure that only the mixer 402's output drives the amplifier 223's input and the current to voltage convertor 222's output does not cause changes to the amplifier 223's input. One way of ensuring that a circuit (e.g. mixer 402 or current to voltage converter 222) doesn't cause change to amplifier 223's input is by powering down that circuit, while the other circuit is operational. Many other similar circuit methods exist for achieving the same result that will be apparent to those having ordinary skill in the art.

Figure 7A:
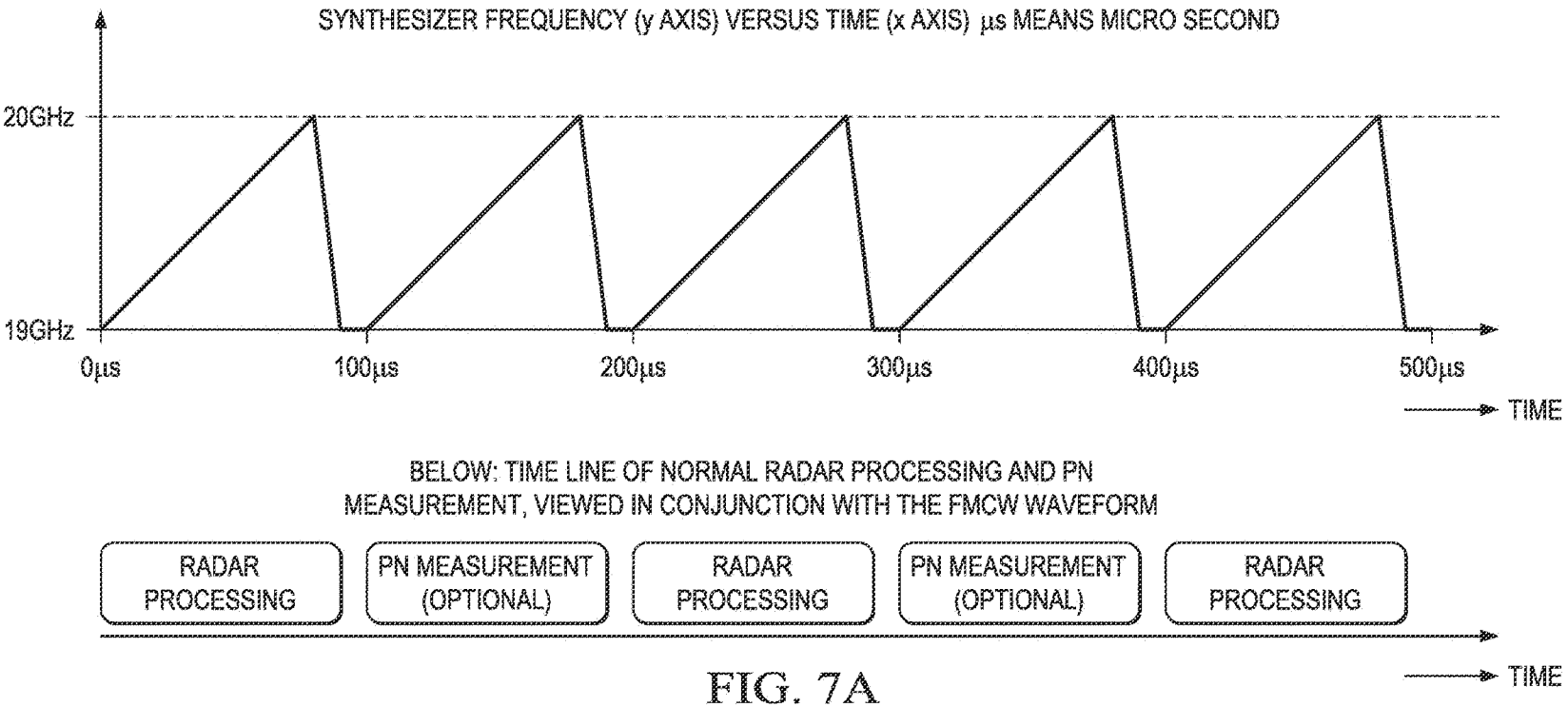
FIGS. 7A, 7B and 7C show example methods of scheduling the normal radar processing and PN measurement process, viewed in conjunction with the radar apparatus's frequency synthesizer's frequency variation over time.
Figure 7B:
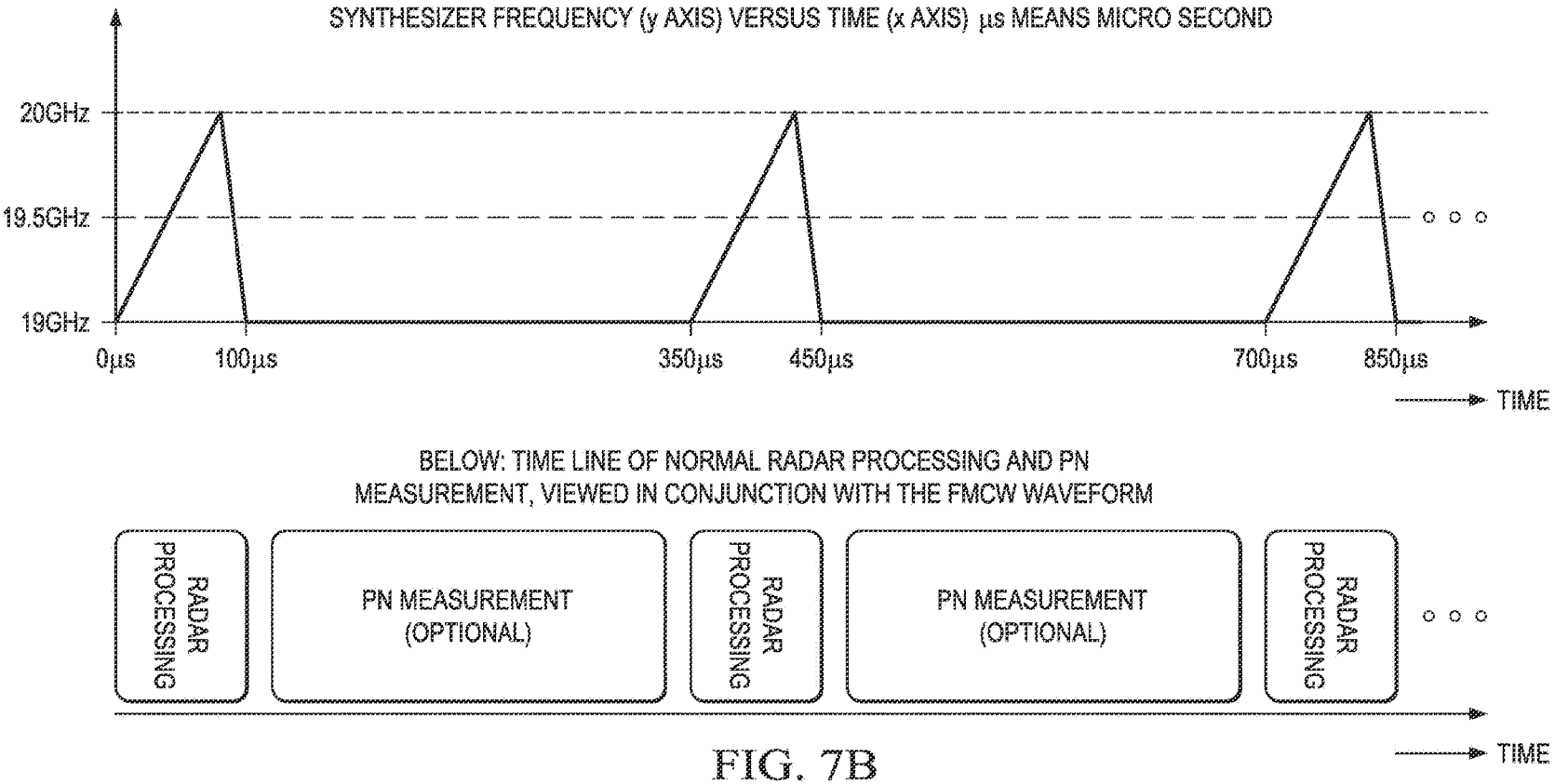
Figure 7C:
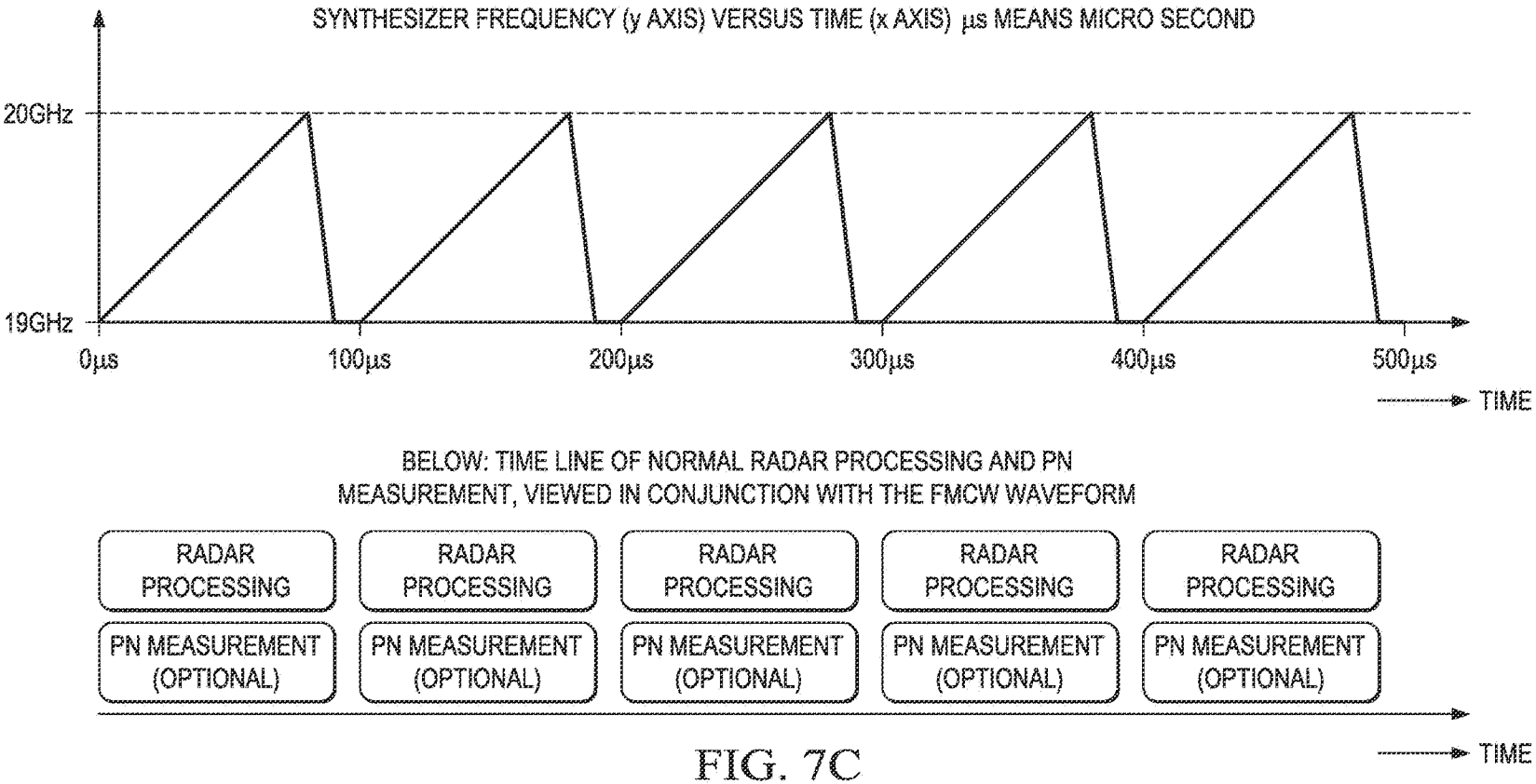

A radar apparatus disclosed herein uses a FMCW synthesizer and PN measurement circuitry and method. The radar apparatus performs normal radar processing (transmitting an FMCW signal and receiving reflections from obstacles and processing the received signal to detect presence, position and velocities of the obstacles) and PN measurement process. The radar apparatus, in at least some embodiments, also includes a PN measurement scheduler, which is a digital finite state machine. The digital finite state machine can be implemented using software or firmware or hardware and controls when the PN measurements and when the normal radar processing are conducted. FIG. 7A, FIG. 7B and FIG. 7C described in the Examples below illustrate some ways the PN measurement scheduler causes normal radar processing and PN measurement to occur.

Advantages of disclosed embodiments include on-chip dynamic PN measures for a frequency synthesizer, such as in one embodiment to provide a prompt message to radar controller unit if the synthesizer fails in meeting its expected performance levels during field usage, and the PN measurement can be carried out on the frequency synthesizer in the same (FMCW) mode as it is used in during normal radar operation. Products that may utilize disclosed embodiments include the Texas Instrument Incorporated's AR12xx, AR16xx or automotive radar product line which are radar sensors for advanced driver assistance, collision avoidance, parking assist, and automated braking.

EXAMPLES

Disclosed embodiments are further illustrated by the following specific Examples, which should not be construed as limiting the scope or content of this Disclosure in any way.

FIG. 5 provides a data table which shows calculated measured parameters obtained from the combination circuit 300 shown in FIG. 3 including PN as a function of the offset frequency from a 900 MHz carrier frequency. $I_{CP2}$=1.256 mA (where Icp2 is the replica PFD/CP current of the replica PN measurement error detector 221), $R_{I2V}$ in LPF 224=10 kΩ and $V_{n_amp_i2v}$ (input referred voltage noise of the I2V converter 222)=5 nV/√Hz. The PN measured can be seen to be at a higher level as compared to the ADC noise, so that the PN can be measured by the PN measurement circuitry 220''' including ADC 225. The ADC noise PSD is at −146 dBV rms/Hz.

As shown in FIG. 5 the noise PSD created by PN monitor circuitry 220''' at the input to the ADC 225 due to PN at various offsets is greater than the ADC noise PSD. For example, the PN at 1 MHz offset translates to −118 dBV rms/Hz whereas the ADC noise PSD itself is −146 dBV rms/Hz.

FIG. 6 shows example spur detection sensitivity that may be obtained from disclosed PN measurement circuitry and FFT durations that may be used, according to an example embodiment. Fs refers to the ADC sampling frequency which was 20 MHz in this example allowing collection of 2,000 points (N) with a frequency interval (Fbin) of 10 kHz. As shown to measure PN, FFT operation can comprise collecting ADC data at Fs=20 MHz ADC data N=2K points, Fbin=10 kHz. To measure phase spur, since phase spur detection is recognized to inherently be limited by PN, multiple FFTs can be performed and non-coherent accumulation (NCA) used from a plurality of FFTs as shown for improving spur detection. As shown in the table provided, one can choose the #FFT (NCA) based on the needed spur detection sensitivity and the allotted measurement time.

FIG. 7A, FIG. 7B and FIG. 7C illustrate example methods the PN measurement scheduler causes normal radar processing and PN measurement to occur. A variety of other methods may exist, that will be apparent to those having ordinary skill in the art. FIG. 7A illustrates a first example method of scheduling PN measurement. This way is suggested if the PN measurement circuitry reuses (shares) some radar receiver circuitry. This scheduling is possible even if the PN measurement circuitry does not share any radar receiver circuitry. In this example the frequency is shown as saw-tooth modulated although this method generally works for any modulation scheme. The FMCW signal's frequency's variation over time, along with a time line (scheduling) of normal radar processing and PN measurement are shown in FIG. 7A. The PN measurement is shown as carried out while making the synthesizer output the same FMCW pattern as it does during normal radar operation. Thus PN measurements are made under conditions very similar, with respect to the synthesizer to those prevailing in normal radar operation.

FIG. 7B shows a second example method of scheduling PN measurements that is similar to the method described relative to FIG. 7A, except that the PN measurement is made with the synthesizer outputting a constant frequency CW. The constant frequency can be chosen to be inside or in the vicinity of the frequency range that is used for normal radar operation. This method assumes that the PN measured with constant frequency setting is approximately or exactly the same as the PN expected during the modulated operation of the synthesizer during normal radar operation. As with the previous example, in this example the frequency although shown as saw-tooth modulated can generally be any other modulation scheme.

FIG. 7C shows a third example method of scheduling PN measurement. This method is possible if PN measurement circuitry does not reuse (share) any radar receiver circuitry. As with the previous examples, although in this example the frequency is shown as saw-tooth modulated can generally be any other modulation scheme. Here the PN measurement process occurs simultaneously with the actual radar signal generation (by the synthesizer), transmission and processing. One advantage of this scheduling method is that no additional time is needed purely for the purpose of checking the PN performance of the synthesizer as it occurs in parallel with normal radar operation.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

[1. A method of measuring phase noise (PN), comprising:

providing (i) a phase lock loop (PLL)-based frequency synthesizer that includes a first error detector including a first phase frequency detector (PFD) having an input receiving a reference frequency signal coupled to a first charge pump (CP) that is coupled to a voltage controlled oscillator (VCO) having an output fed back to said first error detector through a feedback divider that provides a divided frequency signal to another input of said first PFD, said first PFD outputting an error signal and (ii) PN measurement circuitry comprising at least a replica CP coupled to an output of a second PFD or coupled to an output of said first PFD;

receiving said error signal at an input of said replica CP or said divided frequency signal and said reference frequency signal at an input of second PFD, wherein an output of said replica CP provides a scaled phase error current;

current-to-voltage converting and amplifying said scaled phase error current to provide an amplified phase error voltage;

digitizing said amplified phase error voltage to provide a digital phase error signal, and frequency analyzing said digital phase error signal to generate a PN measurement at one or more frequencies.]

[2. The method of claim 1, wherein said PN measurement circuitry includes said second PFD to provide a replica PN measurement error detector, and wherein said first PFD and said second PFD are separate PFDs.]

[3. The method of claim 1, wherein said PN measurement circuitry shares said first PFD with said frequency synthesizer.]

[4. The method of claim 1, wherein said PN measurement circuitry includes an analog-to-digital converter (ADC) for said digitizing, wherein outputs of said ADC (ADC outputs) are provided to a digital filter that selects a certain range of frequencies, and implements measuring a measured power of a signal at an output of said digital filter and comparing said measured power with pre-stored power thresholds.]

[5. The method of claim 1, wherein said PN measurement circuitry includes an analog-to-digital converter (ADC) for said digitizing, wherein outputs of said ADC (ADC outputs) are provided to a Fourier transform (FT) unit or a processor that performs a FT on said ADC outputs, and implements measuring power of a certain set of frequencies and comparing them with at least one of pre-stored thresholds and an average of a plurality of neighboring frequencies.]

[6. The method of claim 1, wherein said PN measurement circuitry is on a common semiconductor substrate with said frequency synthesizer so that said PN measurement circuitry provides built in self-test (BIST) for said frequency synthesizer.]

[7. The method of claim 1, wherein said method is implemented for a driver-assist radar system which includes said frequency synthesizer, further comprising a processor for comparing a measured PN spectrum to a threshold noise measure to determine whether said frequency synthesizer is operating within a specified PN limit, and wherein when said frequency synthesizer is determined to not be operating within said specified PN limit said processor implements sending a control signal that disables or modifies configurations of said driver assist system for reducing a weight given to information from said driver-assist radar system.]

[8. The method of claim 1, wherein PN measurement circuitry further comprises a current-to-voltage converter and amplifier and said frequency synthesizer further comprises a low pass filter (LPF) between said first error detector and said VCO, further comprising buffering an output of said LPF to provide a buffered output and coupling said buffered output to an input of said current-to-voltage converter and to an input of said amplifier.]

[9. The method of claim 1, wherein there is a radar receiver (RX) on a common semiconductor substrate with said PN measurement circuitry for generating said PN measurement, further comprising said frequency synthesizer generating a frequency modulated continuous wave (FMCW) signal when at least one of normal radar operation of said RX or said PN measurement by said PN measurement circuitry is occurring.]

[10. A circuit combination, comprising:

a phase lock loop (PLL) frequency synthesizer including a first error detector including a first phase frequency detector (PFD) having an input for receiving a reference frequency signal coupled to a first charge pump (CP) that is coupled to a voltage controlled oscillator (VCO) having an output fed back to said first error detector after frequency division by a feedback divider to provide a divided frequency signal to another input of said first PFD, said first PFD outputting an error signal;

phase noise (PN) measurement circuitry including:

a replica CP coupled to an output of a second PFD or coupled to an output of said first PFD, wherein said replica CP is for outputting a scaled phase error current;

a current-to-voltage converter and amplifier for current-to-voltage converting and amplifying said scaled phase error current to provide an amplified phase error voltage;

an analog-to-digital converter (ADC) for digitizing said amplified phase error voltage to provide a digital phase error signal, and a processor for frequency analyzing said digital phase error signal for generating a PN measurement at one or more frequencies, and for comparing said PN measurement to a stored threshold noise measure to determine whether said frequency synthesizer is operating within a specified PN limit.]

[11. The circuit combination of claim 10, wherein said PN measurement circuitry includes said second PFD to provide a replica PN measurement error detector, and wherein first PFD and said second PFD are separate PFDs.]

[12. The circuit combination of claim 10, wherein said PN measurement circuitry shares said first PFD with said frequency synthesizer.]

[13. The circuit combination of claim 10, further comprising a frequency multiplier coupled to an output of said VCO.]

[14. The circuit combination of claim 10, further comprising a low pass filter (LPF) between said first error detector and said VCO of said frequency synthesizer and a buffer between an output of said LPF and an input of said current-to-voltage converter and an input of said amplifier.]

[15. The circuit combination of claim 10, wherein said PN measurement circuitry is on a common semiconductor substrate with said frequency synthesizer so that said PN measurement circuitry provides built in self-test (BIST) for said frequency synthesizer.]

[16. The circuit combination of claim 10, further comprising a radar receiver (RX) on a common semiconductor substrate, wherein at least said ADC and said processor are shared by said RX said PN measurement circuitry.]

[17. The circuit combination of claim 16, where said frequency synthesizer is for generating a FMCW signal when at least one of normal radar operation of said RX or said PN measurement is occurring.]

[18. The circuit combination of claim 10, wherein said processor is programmed for automatically disabling a driver-assist radar system including said frequency synthesizer whenever said frequency synthesizer is determined by said processor to not be operating within said specified PN limit.]

[19. The circuit combination of claim 18, wherein said PN measurement circuitry is engaged at intervals during time slots when radar transmission from said driver-assist radar system is not occurring.]

[20. The circuit combination of claim 18, where said PN measurement circuitry is engaged during times radar transmission from said driver-assist radar system is occurring for measuring PN performance simultaneously with a collection of received signal's digital samples for radar processing.]

[21. The circuit combination of claim 18, wherein said processor is programmed for comparing a measured PN spectrum to a threshold noise measure to determine whether said frequency synthesizer is operating within said specified PN limit, and wherein when said frequency synthesizer is determined to not be operating within said specified PN limit said processor implements sending a control signal that disables or modifies configurations of said driver-assist radar system for reducing a weight given to information from said driver-assist radar system.]

[22. A circuit combination, comprising:

a phase lock loop (PLL) frequency synthesizer including a first error detector including a first phase frequency detector (PFD) having an input for receiving a reference frequency signal coupled to a first charge pump (CP) that is coupled to a voltage controlled oscillator (VCO) having an output fed back to said first error detector after frequency division by a feedback divider to provide a divided frequency signal to another input of said first PFD, said first PFD outputting an error signal;

phase noise (PN) measurement circuitry including:

a replica phase noise (PN) measurement error detector including a second PFD coupled to a replica CP, wherein said replica CP is for outputting a scaled phase error current;

a current-to-voltage converter and amplifier for current-to-voltage converting and amplifying said scaled phase error current to provide an amplified phase error voltage;

an analog-to-digital converter (ADC) for digitizing said amplified phase error voltage to provide a digital phase error signal, and a processor for frequency analyzing said digital phase error signal for generating a PN measurement at one or more frequencies, wherein said processor is for comparing said PN measurement to a threshold noise measure to determine whether said frequency synthesizer is operating within a specified PN limit.]

*23. A circuit comprising:*

*a first phase frequency detector (PFD) having an input, and first and second outputs;*

*a first charge pump (CP) having an input and an output, the input of the first CP coupled to the first output of the first PFD;*

*an oscillator having an input and an output, the input of the oscillator coupled to the output of the first CP;*

*a frequency divider having an input and an output, the input of the frequency divider coupled to the output of the oscillator and the output of the frequency divider coupled to the input of the first PFD;*

*a second CP having an input and an output, the input of the second CP coupled to the second output of the first PFD; and*

*an analog-to-digital converter (ADC) having an input and an output, the input of the ADC coupled to the output of the second CP.*

*24. The circuit of claim 23, further comprising a Fourier transforrn module having an input coupled to the output of the ADC.*

*25. The circuit of claim 24, further comprising a comparator coupled to the Fourier transforrn module, the comparator configured to compare an output of the Fourier transforrn module to a stored threshold noise measurement.*

*26. The circuit of claim 23, further comprising a frequencv multiplier coupled to the output of the oscillator.*

*27. The circuit of claim 23, further comprising a low pass filter (LPF) having an input and an output, the input of the LPF coupled to the output of the first CP, and the output of the LPF coupled to the input of the oscillator.*

*28. The circuit of claim 23, further comprising a current-to-voltage converter having an input and an output, the input of the current-to-voltage converter coupled to the output of the second CP, and the output of the current-to-voltage converter coupled to the input of the ADC.*

*29. The circuit of claim 28, further comprising a low pass filter (LPF) having an input coupled the output of the current-to-voltage converter, and an output coupled to the ADC.*

*30. The circuit of claim 23, wherein the circuit is on a semiconductor sub strate.*

*31. The circuit of claim 23, further comprising a radar receiver (RX) coupled to the output of the ADC.*

*32. The circuit of claim 31, further comprising a driver-assist radar svstem coupled to the radar receiver and configured to alter a driver-assist feature based on the output of the ADC.*

*33. The circuit of claim 23, wherein the oscillator is configured to generate a frequencv-modulated continuous wave (FMCW) signal.*

*34. The circuit of claim 23, wherein the oscillator is a voltage controlled oscillator (VCO).*

*35. The circuit of claim 23, further comprising a signal generator coupled to a second input of the first PFD.*

*36. A circuit comprising:*

*a first detector having an input, and first and second outputs;*

*a first charge pump (CP) having an input and an output, the input of the first CP coupled to the first output of the first detector;*

*an oscillator having an input and an output, the input of the oscillator coupled to the output of the first CP;*

*a frequencv divider having an input and an output, the input of the frequencv divider coupled to the output of the oscillator and the output of the frequencv divider coupled to the input of the first detector;*

*a second CP having an input and an output, the input of the second CP coupled to the second output of the first detector; and*

*an analog-to-digital converter (ADC) having an input and an output, the input of the ADC coupled to the output of the second CP.*

*37. The circuit of claim 36, wherein the oscillator is a voltage controlled oscillator (VCO).*

*38. The circuit of claim 36, further comprising a signal generator coupled to a second input of the first detector.*

*39. A circuit comprising:*

*a first detector having an input, and first and second outputs;*

*a first charge pump (CP) having an input and an output, the input of the first CP coupled to the first output of the first detector;*

*an oscillator having an input and an output, the input of the oscillator coupled to the output of the first CP;*

*a frequencv divider having an input and an output, the input of the frequencv divider coupled to the output of the oscillator and the output of the frequencv divider coupled to the input of the first detector;*

*a second CP having an input and an output, the input of the second CP coupled to the input of the first detector; and*

*an analog-to-digital converter (ADC) having an input and an output, the input of the ADC coupled to the output of the second CP.*

*40. The circuit of claim 39, further comprising a second detector having an input and an output, the input of the second detector coupled to the input of the first detector, and the output of the second detector coupled to the input of the second CP.*

*41. The circuit of claim 40, further comprising a signal generator coupled to a second input of the first detector and to a second input of the second detector.*

*42. The circuit of claim 39, wherein the oscillator is a voltage controlled oscillator (VCO).*

*43. The circuit of claim 39, further comprising a current-to-voltage converter having an input and an output, the input of the current-to-voltage converter coupled to the output of the second CP, and the output of the current-to-voltage converter coupled to the input of the ADC.*

*44. The circuit of claim 43, further comprising a low pass filter (LPF) coupled between the input of the current-to-voltage converter and the output of the current-to-voltage converter.*

* * * * *